United States Patent [19]

Gillespie

[11] 4,399,416

[45] Aug. 16, 1983

[54] FLOATING POINT AMPLIFIER

[75] Inventor: Ronald G. Gillespie, Old Tappan, N.J.

[73] Assignee: Texaco Development Corporation, White Plains, N.Y.

[21] Appl. No.: 205,358

[22] Filed: Nov. 10, 1980

[51] Int. Cl.$^3$ .............................................. H03G 3/20
[52] U.S. Cl. ..................................... 330/86; 330/136; 330/144; 330/280; 330/282; 367/65
[58] Field of Search ................... 330/51, 86, 127, 129, 330/136, 138, 144, 145, 279, 280, 282; 367/65, 66, 67

[56] References Cited

U.S. PATENT DOCUMENTS

| | | | |
|---|---|---|---|
| 2,930,987 | 3/1960 | Groce et al. | 330/136 |
| 2,939,107 | 5/1960 | Ball | 330/136 X |
| 3,158,818 | 11/1964 | Plumpe | 330/136 X |
| 3,441,867 | 4/1969 | Davison | 330/136 X |
| 4,031,504 | 6/1977 | Mioduski | 330/86 X |
| 4,048,635 | 9/1977 | Bich | 367/67 X |
| 4,070,632 | 1/1978 | Tuttle | 330/136 X |
| 4,091,380 | 5/1978 | Yu | 330/144 X |
| 4,158,819 | 6/1979 | Smither | 330/9 |

*Primary Examiner*—James B. Mullins
*Attorney, Agent, or Firm*—Carl G. Ries; Robert A. Kuleson; Ronald G. Gillespie

[57] ABSTRACT

A wide dynamic range automatic gain ranging amplifier system includes an amplifier which receives an analog input signal and amplifies the received analog input signal in accordance with gain control signals to provide an amplified signal. A network connected to the amplifier also receives the analog input signal and provides the gain control signals corresponding to a desired gain for the amplifier in accordance with the received input signal and also provides gain status signals representative of the gain associated with the amplified signal.

10 Claims, 5 Drawing Figures

FLOATING POINT AMPLIFIER

BACKGROUND OF THE INVENTION

Field of the Invention

The present invention relates to amplifier means and methods in general and, more particularly, to floating point amplifier means and methods.

SUMMARY OF THE INVENTION

A wide dynamic range automatic gain ranging amplifier system includes an amplifier, adapted to receive an analog input signal, amplifies a received analog input signal in accordance with gain control signals. A network, connected to the amplifier, also receives the analog input signal and provides the gain control signals to the amplifier, corresponding to a desired gain for the amplifier, in accordance with the received input signal. The network also provides gain status signals representative of the gain associated with the amplified analog signal.

The objects and advantages of the invention will appear more fully hereinafter from a consideration of the detailed description which follows, taken together with the accompanying drawings wherein two embodiments of the invention is illustrated by way of example. It is to be expressly understood, however, that the drawings are for illustration purposes only and are not to be construed as defining the limits of the invention.

DESCRIPTION OF THE INVENTION

Floating point amplifiers play an integral part of seismic data recording. The present invention relates to a floating point amplifier differing from the normal floating point amplifiers in that heretofore floating point amplifiers in order to determine the proper gain for the system compared the output signal with a reference corresponding to the full-scale capability of an analog-to-digital converter used in the system. Further, the majority of floating point amplifiers involved a single comparator necessitating changing the gain of the amplifier each time within an operational cycle to establish the proper gain.

In U.S. Pat. No. 4,194,163 (Gillespie), there is disclosed a single stage operational amplifier which required the switching of feedback resistors and input resistors to an operational amplifier to achieve gain selection. Again, the output of that floating point amplifier was compared with a predetermined reference. In U.S. Pat. No. 4,031,504 (Mioduski) there is shown cascade connected amplifier stages and again, comparing the output with predetermined reference signals to establish the proper gain. In both patents there is a small amount of settling time inherent in the switching of the signals and gains of the amplifier. Further, within an operational cycle as mentioned before, the output must be stepped through a series of amplitudes in order to determine the proper gain.

The present invention has the advantage of being a faster system in that the proper gain is determined instantaneously by comparing the input signal with a plurality of reference input signals related to the various gains and decoding this comparison to provide control signals to switch the gain ranging amplifier to that gain needed. As can be appreciated, there is only one switching involved instead of multiple sequential switching within each operational cycle.

Figure 1:
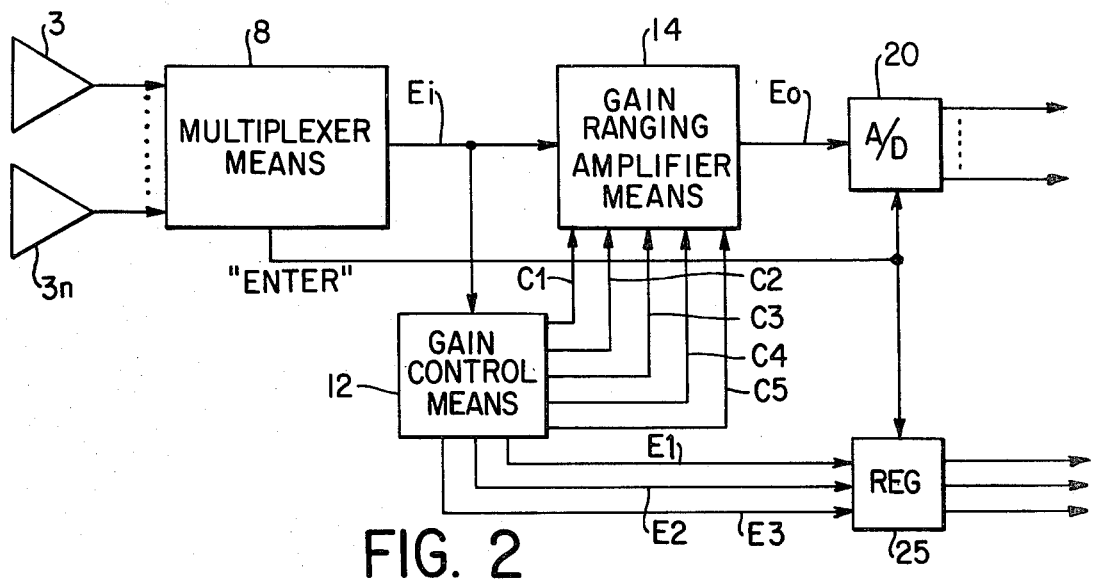
FIG. 1 is a simplified block diagram of a seismic data acquisition system constructed in accordance with the present invention.

With this in mind and referring to FIG. 1, a plurality of seismic detectors 3 through 3$n$ have their outputs applied to a conventional low level multiplexer means 8. Multiplexer means 8 passes the signals from seismic detectors 3 through 3$n$ in a predetermined sequence as signal Ei, an analog input signal, to gain control means 12 and to gain ranging amplifier means 14. Gain control means 12 determines the proper gain for signal Ei and provides control signals C1 through C5, as hereinafter explained, to gain ranging amplifier means 14 to control its gain. Gain ranging amplifier means 14 provides an amplified signal Eo to an analog-to-digital converter 20 which provides corresponding digital signals.

Gain control means 12 also provides gain status signals E1, E2 and E3, relating to the gain associated with signal Eo in binary form, to a register 25. Multiplexer means 8 provides an 'enter' pulse just prior to switching to a new seismic detector which causes analog-to-digital converter 20 to convert signal Eo to digital signals and to enter the signals E1 through E3 into register 25. Register 25 and analog-to-digital converter 20 provides digital signals which may be recorded in conventional digital manners for a permanent record.

Figure 2:
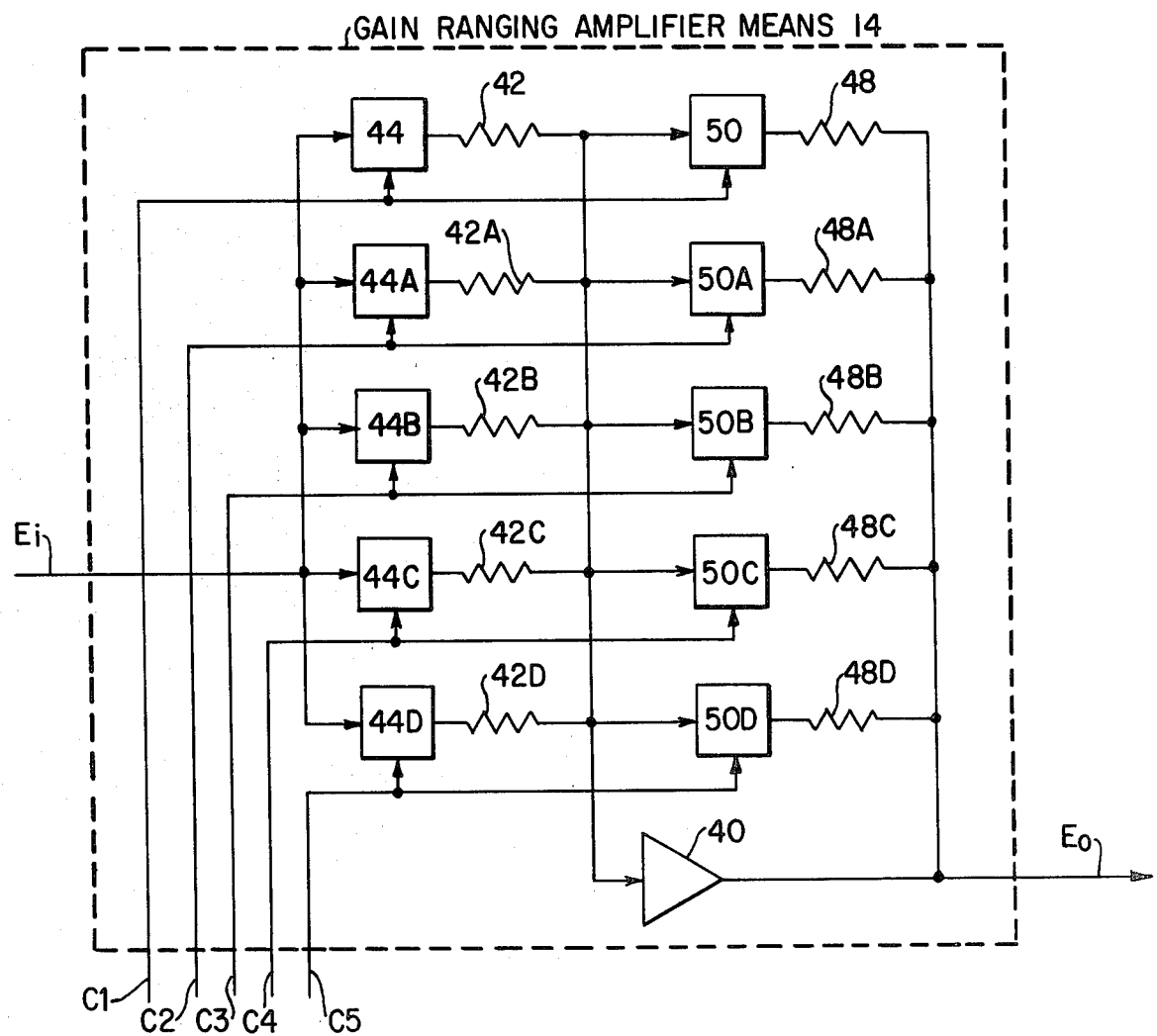
FIG. 2 is a simplified schematic of one embodiment of the gain ranging amplifier means shown in FIG. 1.

Referring now to FIG. 2, there is shown gain ranging amplifier means 14 including an operational amplifier 40 having an input connected to a plurality of input resistors 42 through 42D which, in turn, are connected to a plurality of electronic switch means 44 through 44D, respectively, which are, in effect, single pole, single throw switches. It should be noted that where a number has alpha suffix, it is similar to an element having the same number without a suffix. Switch means 44 through 44D receive signal Ei and gain control signals C1 through C5, respectively, and are controlled by gain control signals C1 through C5 to block or pass signal Ei.

The output of amplifier 40 is connected to a plurality of feedback resistors 48 through 48D which are also connected to the input of amplifier 40 through electronic switch means, of the single pole, single throw type, 50 through 50D, respectively. Switch means 50 through 50D receive control signals C1 through C5, respectively, and are controlled by those signals to connect one of the feedback resistors of resistors 48 through 48D to the input of amplifier 40. The values of input resistors 42 through 42D and 48 through 48D are predetermined and selected to give the operational amplifier a predetermined gain. For example, resistors 42 and 48 correspond to unity gain. Therefore, they would have the same resistance value. A pair of resistors 42A and 48A correspond to a gain of 8, resistors 42B and 48B correspond to a gain of $8^2$, resistors 42C and 48C correspond to a gain of $8^3$, and resistors 42$d$ and 48$d$ correspond to a gain of $8^4$.

Figure 3:
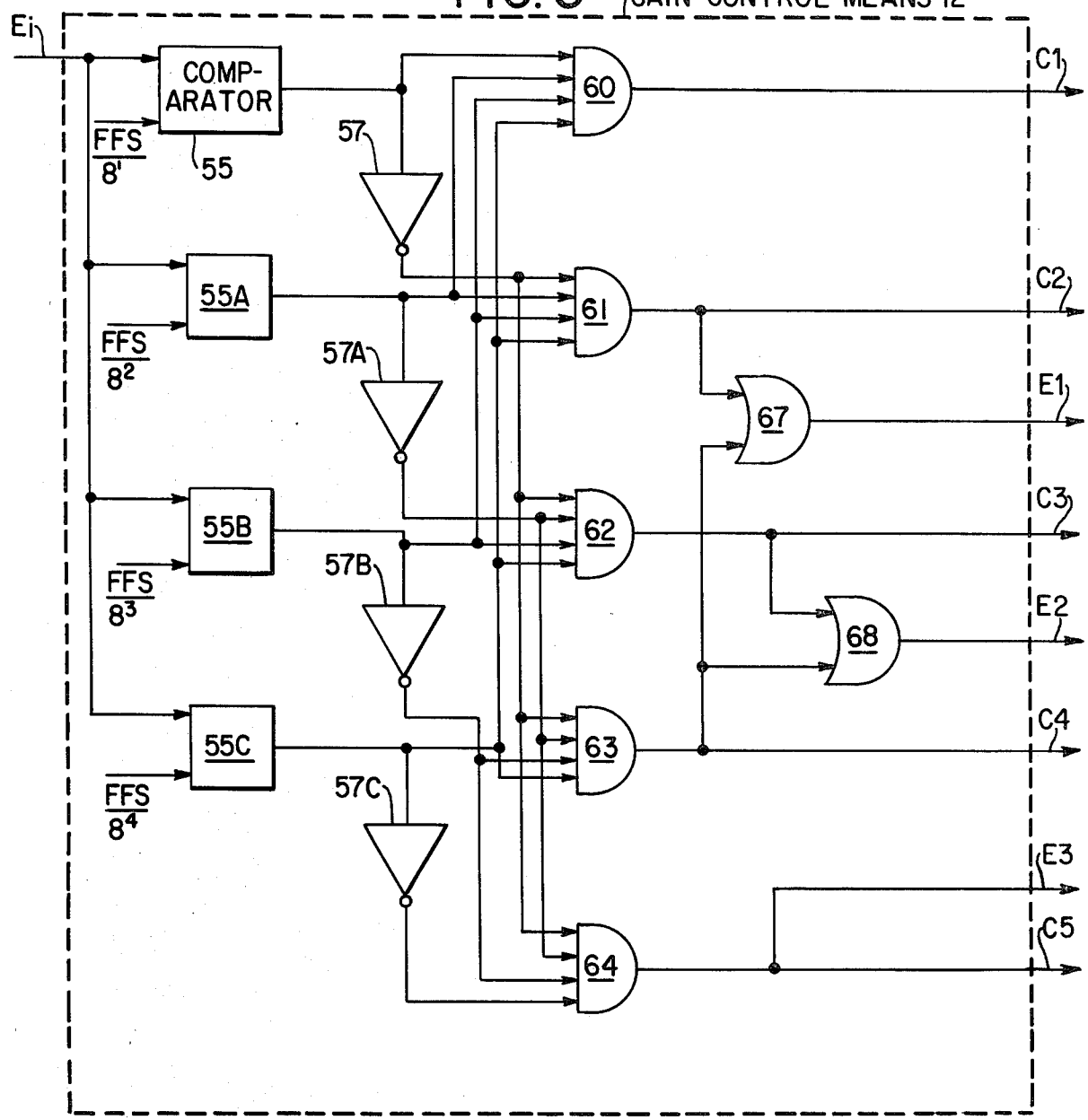
FIGS. 3 and 4 are detailed block diagrams of different embodiments of the gain control means shown in FIG. 1.

Referring now to FIG. 3, signal Ei is supplied to a plurality of comparators 55 through 55C, each comparator receiving a reference input signal which is predetermined. In this regard, the reference input signal corresponds to the fractional full-scale (FFS) of analog-to-digital converter 20 which may be selected as an optimum point for conversion, divided by the gains of amplifier means 14. Thus, for example, we have reference input signals corresponding to $FFS/8^1$, $FFS/8^2$, $FFS/8^3$ and $FFS/8^4$. The output of each comparator of comparators 55 through 55C is connected to inputs of corresponding inverters 57 through 57C. AND gates 60 through 64 are connected to comparators 55 to 55C and inverters 57 through 57C in such a manner so as to decode their outputs to provide the gain control signals C1 through C5, respectively. By way of an example, when signal Ei is so great that only unity amplification is necessary, signal Ei is greater than all of the reference signals applied to comparators 55 through 55C, therefore, they provide high logic level outputs. AND gate 60 connected to all of the comparators is then fully enabled to provide gain control signal C1 at a high logic level which, with reference to FIG. 2, renders switches 44 and 50 conductive so that amplifier 40 has unity gain and essentially signal Ei is provided as signal Eo.

In another example, assuming that signal Ei requires an amplification of $8^2$, signal Ei would be less than reference signals $FFS/8^1$ and $FFS/8^2$ but greater than signals $FFS/8^3$ and $FFS/8^4$. Under that situation, comparators 55 and 55A provide low logic level outputs while comparators 55B and 55C provide high level outputs. Due to the inverting function of inverters 57 and 57A, only AND gate 62 is fully enabled to provide control signal C3 at a high logic level. Again with reference to FIG. 2, gain control signal C3 renders switches 44B and 50B conductive so that the feedback and input resistors for amplifier 40 are resistors 48B and 42B, respectively, which causes amplifier 40 to have a gain of $8^2$.

It is also necessary that since the data is going to be recorded for future use that the gain associated with the output signal at the time of conversion be determined. In this regard, OR gate 67 and 68 are connected to the outputs of AND gates 61, 63 and AND gates 62 and 63, respectively, and provide signals E1 and E2, respectively. The output from AND gate 64 is also provided as signal E3. Together, signals E1 through E3 represent a digital gain status word which for unity gain all three are at a low logic level, for a gain of $8^1$ signal E1 is at a high logic level while signals E2 and E3 are at low logic levels, for a gain of $8^2$ signal E2 is at a high logic level while signals E1 and E3 are at low logic levels, for a gain of $8^3$ signals E1 and E2 are at high logic levels and signal E3 is at a low logic level, and for a gain of $8^4$ signal E3 is at a high logic level and signals E1 and E2 are at low logic levels.

In another embodiment of gain control means 12, comparators 55 through 55C may be replaced by a single comparator 70 receiving signal Ei with its other input being connected to the output of switches 72 through 72C receiving reference input signals. A clock 76 provides clock pulses to an AND gate 78 receiving a comparison signal from comparator 70. The clock pulses are blocked or passed by AND gate 78 in accordance with the comparison signal. AND gate 78 provides passed pulses to counter means 80 which provides signals to switches 72 through 72B and to logic decoder means 84. Logic decode means 84 also receives the comparison signal from comparator 70 and a pulse signal P from counter means 80. The 'enter' pulse from multiplexer means 8 is provided to a one-shot multivibrator 88 which, in turn, provides a 'reset' pulse to clear counter means 80 for the next operational cycle.

In operation, the comparison signal from comparator 70 is initially at a high logic level, thereby enabling AND gate 78 to pass clock pulses from clock 76 to counter means 80. Counter means 80 causes switches 72 through 72C to be sequentially under conductive to pass the reference input signals to comparator 70 with the smallest reference input signal being passed first and the largest reference input signal being passed last.

Assuming the signal Ei requires unity gain, the comparison signal will not change to a low logic level. Counter means 80 will then provide a pulse P to logic decode means 84, causing means 84 to provide only gain control signal C1 at a high logic level.

Assuming that the input signal Ei requires a gain of $8^3$, when the reference input signal is passed by switch 72B, the comparison signal from comparator 70 changes to a low logic level, thereby stopping further counting by counter means 80. The change in the comparison signal also causes logic decoder means 84 to provide gain control signal C4 at a high logic level.

Figure 5:
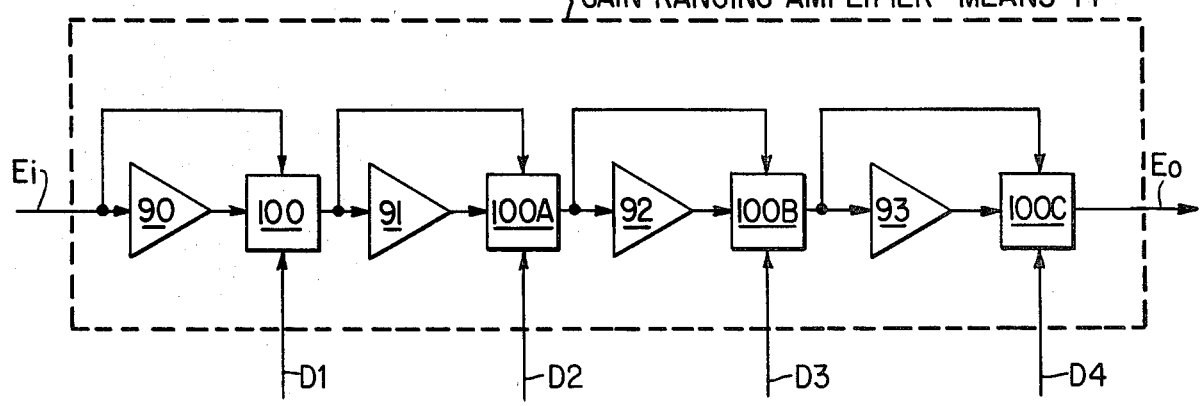
FIG. 5 is a detailed block diagram of another embodiment of the gain ranging amplifier means shown in FIG. 1.
Figure 4:
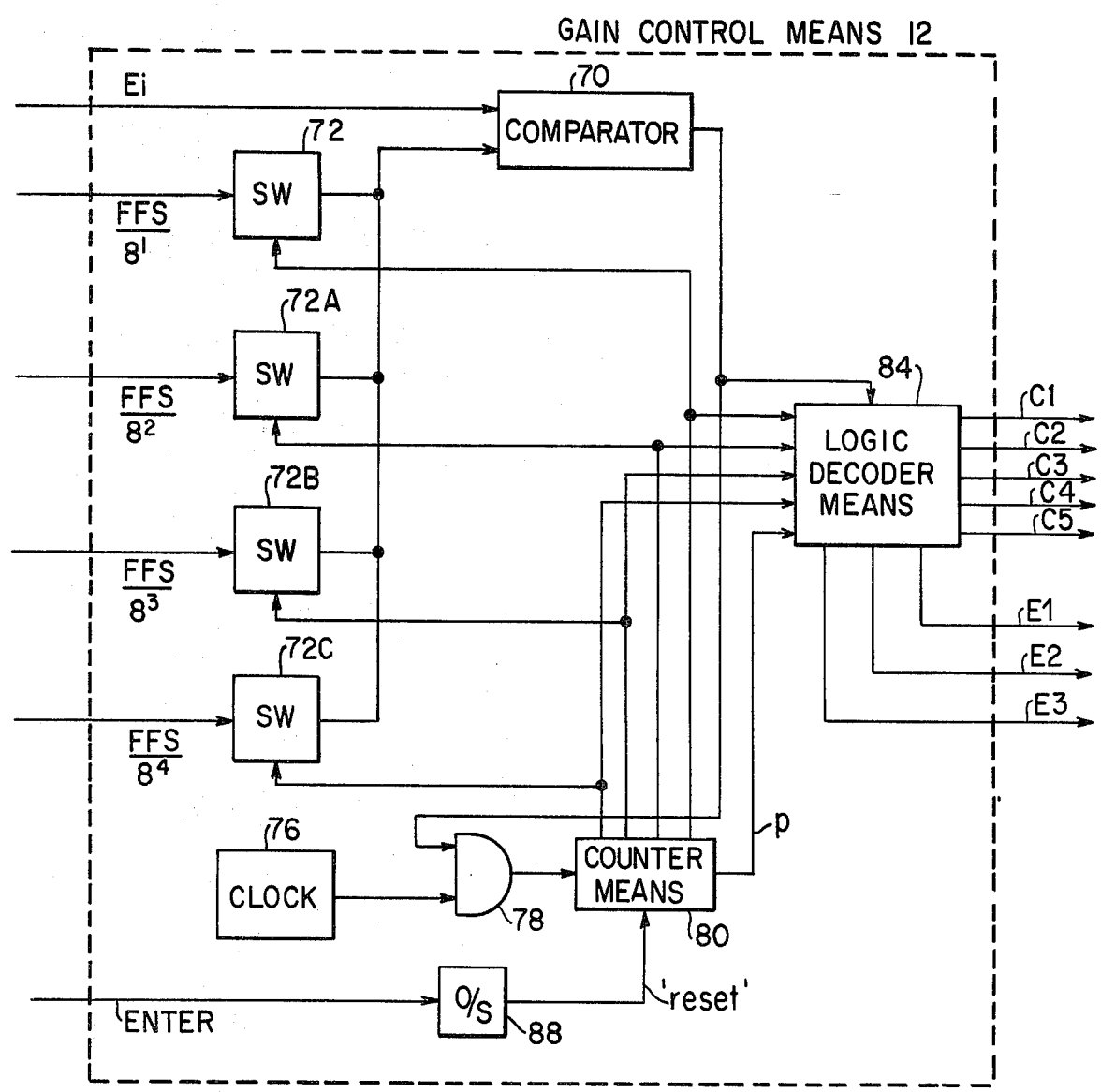

In another embodiment, gain ranging amplifier means 14 may have the form of that shown in FIG. 5 comprising amplifier stages 90, 91, 92 and 93 which may or may not have identical gains. It is obvious from the prior art that with different gains for each amplifier stage a greater variety of overall gain capability of gain ranging amplifier means 14 can be obtained. Suffice to say for the purpose of this invention is that the present invention can be used with the multiple stage amplification system as well as with a single stage. Connected to the output of each amplifier stage 90, 91, 92 or 93 is an input of a corresponding switch means 100, 100A, 100B or 100C, respectively. The input of each amplifier stage 90, 91, 92 or 93 is also connected to another input of each switch means 100, 100A, 100B or 100C, respectively, while the output of switch means 100, 100A and 100B are connected to the inputs of amplifier stages 91, 92 and 93, respectively. The output of switch means 100C is connected to analog-to-digital converter 20. Switch means 100 through 100C are controlled by gain control signals D1 through D4. Switch means 100 through 100C are, in effect, double pole, double throw switches which selects between its two inputs to be provided at its output in accordance with the gain control signal. For a unity gain amplification situation, switch means 100 through 100C will pass the signal appearing at the input of its corresponding amplifier stage as its output and thus, signal Ei would, in effect, bypass amplifier stages 90 through 93 to be provided as signal Eo.

Gain control means 12 would have to be modified to accomplish the gain control. In this regard, it is again preferable to use a plurality of comparators receiving reference input signals. A new decoding logic network would be necessary to decode the outputs of the comparators to provide the signals D1, D2, D3 and D4 to provide corresponding digital gain word signals.

The present invention is a floating point amplifier system which provides substantially instantaneous gain determination and control of wide dynamic range gain ranging amplifier in accordance with the input signal being provided to the amplifier.

What is claimed is:

1. A wide dynamic range automatic gain ranging amplifier system comprising means for receiving an analog input signal to provide a received input signal, amplifier means connected to the receiving means for amplifying a received analog input signal provided by the receiving means in accordance with gain control signals to provide an amplified signal, gain signal means connected to the receiving means and to the amplifier means for providing the gain control signals to the amplifier means corresponding to a desired gain for the amplifier means in accordance with the received input signal and in a manner so as to substantially instantaneously control the gain of the amplifier means and for providing gain status signals representative of the gain associated with the amplified signal in binary digital form, and and analog-to-digital converter means connected to the amplifier means and providing digital signals corresponding to the amplified signal; and said gain signal means includes means connected to the receiving means for comparing a received analog input signal with a plurality of reference input signals and providing corresponding comparison signals, each reference input signal being representative of a ratio of a value, corresponding to a predetermined fractional full scale capability of the analog-to-digital converter means, to a different predetermined gain fo the amplifier means, and decoding means connected to the comparing means for decoding the comparison signals so as to substantially instantaneously provide the gain control signals and the gain status signals.

2. An amplifier system as described in claim 1 in which each reference input signal corresponds to a different gain for the amplifier means.

3. An amplifier system as described in claim 2 in which the decoding means includes a plurality of inverters connected to the comparing means and each inverter inverting a different comparison signal, a plurality of AND gates in which one AND gate is connected to the comparing means and provides one gain control signal in accordance with the comparison signals, one AND gate is connected to the inverters and provides another gain control signal in accordance with the signals from the inverters, and the remaining AND gates are connected to the comparing means and to the inverters and provide the gain control signals in accordance with the comparison signals and the signals from the inverters.

4. An amplifier system as described in claim 3 in which the amplifier means is a single stage amplifier means.

5. An amplifier system as described in claim 3 in which the amplifier means includes a plurality of amplifier stages connected in cascade arrangement in which each amplifier stage is controlled by a corresponding gain control signal to either amplify a signal by a predetermined gain or by unity gain.

6. An amplifier system as described in claim 5 in which each amplifier stage includes an amplifier having a predetermined gain, and by-pass means receiving a gain control signal and responsive to the gain control signal for applying a signal either to the amplifier stage or to by-pass the amplifier stage so as to provide unity gain for the amplifier stage in accordance with a gain control signal.

7. An amplifier system as described in claim 6 in which each by-pass means includes switch means having an output, having one input connected to an output of a corresponding amplifier and having another input connected to the input of the corresponding amplifier for being controlled by the gain control signal to pass either the signal being received by the amplifier so as to effectively by-pass the amplifier or to pass a signal appearing at the output from the amplifier.

8. An amplifier system as described in claim 7 in which the receiving means is adapted to receive a plurality of analog input signals and includes means for multiplexing the analog input signals to provide the received input signal.

9. A wide dynamic range automatic gain ranging amplifier system comprising variable gain amplifier means for amplifying an analog input signal to provide an amplified signal, and means for substantially instantaneously controlling the gain of the amplifier means in accordance with the analog input signal, and analog-to-digital converter means connected to the amplifier means for converting the amplified signal to digital signal; and said gain control means includes means for providing a plurality of reference input signals, each reference input signal corresponding to a ratio of a value, representative of a predetermined fractional full scale capability of the analog-to-digital converter means, to a different predetermined gain for the amplifier means, and a plurality of comparator means for comparing the reference input signals with the analog input signal being applied to the amplifier means and providing corresponding comparison signals, each comparator means comparing a different reference input signal with the analog input signal, and logic means connected to all the comparator means and to the amplifier means for providing the gain control signals to the amplifier means and for providing the gain status signals in accordance with the comparison signals.

10. An amplifier system as described in claim 9 in which the amplifier means is adapted to receive a plurality of analog input signals, and including means for multiplexing the analog input signals to provide the analog input signal to amplifier means.

* * * * *